(12) United States Patent
Marchand et al.

(10) Patent No.: US 10,944,359 B2
(45) Date of Patent: *Mar. 9, 2021

(54) TEMPERATURE COMPENSATION OF A QUARTZ CRYSTAL OSCILLATOR

(71) Applicants: STMicroelectronics (Grenoble 2) SAS, Grenoble (FR); STMicroelectronics (Alps) SAS, Grenoble (FR)

(72) Inventors: Benoit Marchand, Fontanil-Cornillon (FR); Francois Druilhe, Le Versoud (FR)

(73) Assignees: STMicroelectronics (Grenoble 2) SAS, Grenoble (FR); STMicroelectronics (Alps) SAS, Grenoble (FR)

( * ) Notice: Subject to any disclaimer, the term of this patent is extended or adjusted under 35 U.S.C. 154(b) by 0 days.

This patent is subject to a terminal disclaimer.

(21) Appl. No.: 16/207,751

(22) Filed: Dec. 3, 2018

(65) Prior Publication Data

US 2019/0173427 A1 Jun. 6, 2019

(30) Foreign Application Priority Data

Dec. 4, 2017 (FR) ........................... 1761611

(51) Int. Cl.
| | |
|---|---|
| H03B 5/12 | (2006.01) |
| H03C 3/09 | (2006.01) |
| H03L 7/099 | (2006.01) |
| H03B 5/36 | (2006.01) |
| H03L 1/02 | (2006.01) |
| H03L 7/183 | (2006.01) |
| H03B 5/04 | (2006.01) |

(52) U.S. Cl.
CPC ............... *H03B 5/366* (2013.01); *H03B 5/04* (2013.01); *H03L 1/026* (2013.01); *H03L 1/028* (2013.01); *H03L 7/0991* (2013.01); *H03L 7/183* (2013.01)

(58) Field of Classification Search
CPC ......... H03B 5/366; H03B 5/04; H03L 7/0991; H03L 1/028; H03L 1/026; H03L 7/183
USPC ................ 331/36 C, 66, 116 R, 116 FE, 176
See application file for complete search history.

(56) References Cited

U.S. PATENT DOCUMENTS

| | | | |
|---|---|---|---|
| 5,053,723 A | 10/1991 | Schemmel | |
| 5,204,975 A | 4/1993 | Shigemori | |
| 7,868,710 B1 | 1/2011 | Farahvash et al. | |
| 7,990,226 B1 * | 8/2011 | Aycock | H03J 1/0008 331/158 |

(Continued)

OTHER PUBLICATIONS

Tran Trong-Hieu et al: "A Low-ppm Digitally Controlled Crystal Oscillator Compensated by a New 0.19-mm2 Time-Domain Temperature Sensor", IEEE Sensors Journal, IEEE Service Center, New York, NY, US, vol. 17, No. 1, Jan. 1, 2017 (Jan. 1, 2017), pp. 51-62, XP011636535, ISSN: 1530-437X, DOI: 10.1109/JSEN.2016.2623744 [extrait le Dec. 8, 2016] Section: III.B.Digital-Compensated Crystal Oscillator (DCXO); figures 9-13.

(Continued)

*Primary Examiner* — Richard Tan
(74) *Attorney, Agent, or Firm* — Crowe & Dunlevy

(57) ABSTRACT

A quartz crystal resonator is coupled to an electronic circuit. A capacitive or resistive element is provided for adjusting a frequency of the quartz crystal resonator on activation or deactivation of a function of a circuit. Control is made according to a model of an expected variation of a temperature of the quartz crystal resonator.

23 Claims, 4 Drawing Sheets

(56) References Cited

U.S. PATENT DOCUMENTS

| | | | |
|---|---|---|---|
| 2006/0267701 A1* | 11/2006 | Eilers | H03B 5/366 331/158 |
| 2011/0109359 A1* | 5/2011 | Greenberg | H03B 5/02 327/158 |
| 2012/0032718 A1 | 2/2012 | Chan et al. | |
| 2019/0058630 A1* | 2/2019 | Magley | H04L 12/189 |
| 2019/0173426 A1* | 6/2019 | Marchand | H03B 5/04 |

OTHER PUBLICATIONS

INPI Search Report and Written Opinion for FR 1761611 dated Aug. 10, 2018 (8 pages).

* cited by examiner

TEMPERATURE COMPENSATION OF A QUARTZ CRYSTAL OSCILLATOR

PRIORITY CLAIM

This application claims the priority benefit of French Application for Patent No. 1761611, filed on Dec. 4, 2017, the content of which is hereby incorporated by reference in its entirety to the maximum extent allowable by law

TECHNICAL FIELD

The present disclosure generally relates to electronic circuits and, more specifically, to circuits comprising microprocessors or microcontrollers. The present disclosure more particularly applies to electronic circuits having a frequency extracted from a quartz crystal resonator.

BACKGROUND

The use of a quartz crystal resonator to generate a clock signal in an electronic circuit is particularly common, in particular in systems comprising microprocessors or microcontrollers. The quartz crystal resonator is a component different from the other electronic circuits, assembled on an interconnection plate, typically a printed circuit wafer receiving the microcontroller and other circuits of the system.

In most applications, the quartz crystal resonator has the advantage of providing a temperature-stable frequency (with a variation in the order of 0.5 ppm/° C.) in the usual temperature range. However, in certain applications, such accuracy appears to be insufficient.

Temperature-compensated quartz oscillators (TCXO), provided in the form of dedicated integrated circuits, are known, but such circuits are generally complex and expensive.

SUMMARY

It would be desirable to have a temperature-stable signal based on a quartz crystal oscillator.

It would also be desirable to have a simple and inexpensive circuit.

An embodiment decreases all or part of the disadvantages of known techniques for generating a signal from a quartz crystal resonator.

An embodiment provides a solution avoiding a permanent measurement of temperature.

An embodiment provides a solution compatible with existing circuits of capacitive or resistive adjustment of the frequency of a quartz crystal resonator.

Thus, an embodiment provides a method of controlling a quartz crystal resonator coupled to an electronic circuit, wherein at least one capacitive or resistive element for adjusting the quartz crystal resonator frequency is, on activation or deactivation of a function of the circuit, controlled according to a model of an expected variation of the quartz crystal temperature.

According to an embodiment, said model is applied to an initial temperature measured on activation or deactivation of the function.

According to an embodiment, said model is represented by a table of control values for said capacitive or resistive element.

According to an embodiment, said element is an array of switchable capacitors.

According to an embodiment, said array is pulse-width modulation controlled.

According to an embodiment, said model is obtained by measurement of the variation of the frequency supplied by the quartz crystal resonator as a result of the activation or the deactivation of said function.

According to an embodiment, said measurement of the frequency variation is performed on a test circuit.

According to an embodiment, said function is a radio frequency transmission function.

According to an embodiment, the transmission function respects the LoRa standard.

An embodiment provides an electronic device comprising a circuit and a quartz crystal resonator, configured to implement the described method.

According to an embodiment, said circuit is a microcontroller.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

Figure 1:
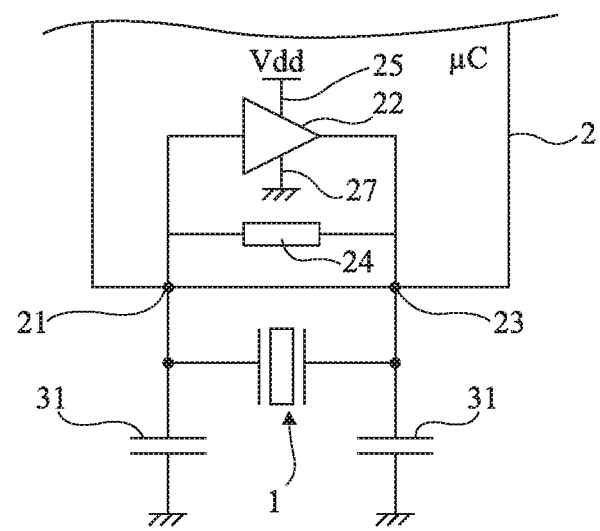
FIG. 1 is a simplified representation of an electronic system using a quartz crystal resonator.

The same elements have been designated with the same reference numerals in the different drawings.

For clarity, only those steps and elements which are useful to the understanding of the embodiments which will be described have been shown and will be detailed. In particular, the use by the electronic circuit(s) coupled with the quartz crystal resonator of the signal generated by said quartz crystal resonator has not been detailed, the described embodiments being compatible with usual applications of clock signals based on a quartz crystal resonator.

Unless otherwise specified, when reference is made to two elements connected together, this means directly connected with no intermediate element other than conductors, and when reference is made to two elements coupled together, this means that the two elements may be directly coupled (connected) or coupled via one or a plurality of other elements.

In the following description, when reference is made to terms "approximately", "about", and "in the order of", this means to within 10%, preferably to within 5%.

FIG. 1 is a simplified representation of an electronic system using a quartz crystal resonator.

A quartz crystal resonator 1 is connected, by its two electrodes, to terminals 21 and 23 of an electronic circuit 2, for example, a microprocessor or a microcontroller (µC). Terminals 21 and 23 are coupled, respectively to the input and to the output of an amplifier 22 (inverter) powered with a DC voltage Vdd, for example, extracted from power supply voltage Vdd between two terminals 25 (at potential Vdd) and 27 at ground. A resistive element 24 further couples terminals 21 and 23. Capacitive elements 31 couple the electrodes of quartz crystal resonator 1 to ground 27. The function of capacitive elements 31 and of resistive element 24 is to adjust the resonance frequency of quartz crystal resonator 1. According to the applications, elements 31 are internal or external to circuit 2.

The oscillation frequency of quartz crystal resonator 1 is likely to be disturbed by its assembly and by the interactions with microcontroller 2 having the quartz crystal resonator connected thereto and the corresponding connections on the printed circuit wafer (not shown). To set the oscillation frequency, once quartz crystal resonator 1 and microcontroller 2 are assembled on the wafer, a calibration of quartz crystal resonator 1 is performed to adjust the value of capacitive elements 31 and to obtain the desired oscillation frequency. Such an adjustment is performed once and for all during an initial calibration at the first powering on of the electronic system. The adjustment is thus static.

However, in certain applications, a heating of the circuit in certain operating phases generates a drift in the frequency of quartz crystal resonator 1 by too strong proportions. In particular, in radio frequency transmit-receive applications, needs have to be met, in terms of transmission power, which generate a heating such that the resonance frequency of quartz crystal resonator 1 varies by proportions such that the carrier frequency is no longer maintained within the desired frequency range. This phenomenon is further transient in the circuit lifetime, in that it only occurs during transmission phases.

Indeed, it could have been envisaged to take into account the highest operating frequency during the initial calibration phase. However, the oscillation frequency would then not be that desired outside of transmission periods.

Such a problem of temporary overheating is particularly present in circuits compatible with transmissions according to the LoRa, LoRaWan, or the like standards. In such applications, the transmission protocols require phases of transmission at a power of several tens of dBm for a duration in the order of one second, which are separated by durations in the order of some hundred seconds. Accordingly, this is not a durable heating, but an abrupt and temporary heating between periods sufficiently long for the circuit to have time to cool down.

Typically, the LoRa standard requires transmission powers of several tens of dBm (for example, in the order of 22 dBm). This generates a heating which is such at the circuit level that the frequency drift can reach in the order of 0.15 ppm during the transmission period. Such a frequency drift of the carrier during transmission phases, and more generally of any frequency derived from the clock signal supplied by the quartz crystal resonator, may turn out being prejudicial to the circuit operation, particularly for the interpretation of the signal in receive mode.

It could have been envisaged to use a temperature-compensated quartz crystal oscillator (TCXO) so that it supplies a steadier frequency than a standard quartz crystal resonator. However, the cost of such temperature-compensated circuits often makes such a solution incompatible with the economic criteria imposed for the production of electronic systems.

It could also have been devised to use a temperature detector to measure the quartz crystal resonator temperature and adjust the frequency by means of a phase-locked loop (PLL). However, such a phase-locked loop would introduce phase noise incompatible, in particular, with radio frequency transmit-receive applications. Further, such a solution does not necessarily provide the required accuracy for the frequency value.

Another possible solution would be to physically move aside, on the printed circuit board, the quartz crystal resonator of the microcontroller or of the radio frequency transmission circuit so that it is less sensitive to a temperature rise during transmissions. Such a solution would also introduce phase noise by the length of the conductive tracks between the quartz crystal resonator and the circuit. Further, this would increase the cost of the solution by increasing the bulk.

The embodiments described hereafter result from a new analysis of the behavior of a quartz crystal resonator in a system equipped with a microcontroller with a radio frequency transmit-receive function and of the static adjustment circuit which is generally associated therewith, in particular in systems where periods of strong temperature rise separated by periods during which the circuit has time to cool down can be observed.

In particular, the variation (in practice, the increase) of the frequency of a quartz crystal resonator when its temperature increases can be analyzed over time. Such an analysis is particularly interesting in the case of a heating due to an activation of a transmit circuit (or more generally of an electronic circuit generating a heating). Indeed, the temperature increase is then progressive while it is desired for the frequency to be stable, including during this increase period.

According to the described embodiments, it is provided to take advantage of this analysis to modify the value of switchable capacitances of adjustment of the quartz crystal resonator operating frequency. The adjustment is performed gradually over time and not according to successive temperature measurements.

Figure 2:
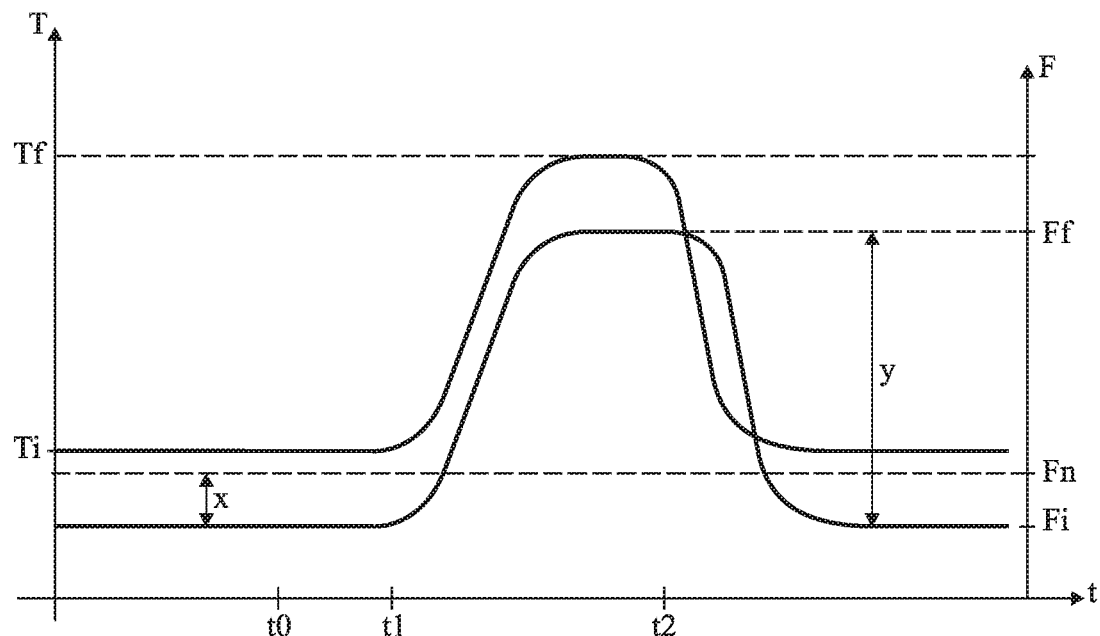
FIG. 2 illustrates, on a same graph, a typical example of variation of the frequency of a quartz crystal resonator over time for a temperature increase.

FIG. 2 illustrates, on a same graph, a typical example of the variation of frequency F of a quartz crystal resonator over time t for an increase of temperature T.

The considered situation corresponds to a transmission according to the LoRa standard, that is, a high power transmission for a short time period (by a ratio of at least 10) with respect to the interval between two transmissions. The turning-on of the radio frequency circuit having its carrier derived from the resonance frequency of the quartz crystal resonator is assumed at a time t0. Before time t0, the circuit operates normally, that is, its operation causes a negligible heating at the quartz level. The frequency is thus stable. The frequency is in principle at level Fn, corresponding to the nominal frequency of the quartz crystal resonator (for example, 32 MHz). FIG. 2 however illustrates an interval x between frequency Fn and a frequency Fi, to highlight the fact that on starting of quartz crystal resonator 1, temperature Ti is not necessarily the reference temperature for which the nominal frequency of the quartz crystal resonator is given. Accordingly, a first compensation need may, if need be, be taken into account to take value Fi back to nominal value Fn.

From time t0, assuming a LoRa protocol, the transmission starts with a synchronization preamble. Then, from a time t1, the actual data transmission starts. The preamble and the data transmission are performed at +22 dBm but the temperature increase can be perceived at the quartz crystal level with a slight delay due to the heat inertia of the system. After this slight delay, the effect of the temperature increase due to the radio frequency transmission can be perceived on the quartz crystal resonator frequency, which increases. Such an increase progressively takes place to reach a level Ff. From a time t2, when the transmission stops, the circuit cools down, which results in a decrease of the quartz crystal resonator frequency. Taking the example of a transmission according to the LoRa protocol, interval y between frequencies Fi and Ff reaches in the order of 1.5 ppm for a temperature variation Tf-Ti of a few degrees. Now, for the reliability of transmissions, it is desired in this example for the frequency to be stable, during the transmission period, to within approximately 0.15 ppm.

Further, for applications where the transmission phases and their transmission power are each time of the same type, it can be observed that such an operation is reproducible, that is, that the frequency variation due to the activation of the radio frequency circuit always has substantially the same general shape for a given initial temperature Ti.

According to a first aspect of the present invention, it is provided to take advantage of this reproducible character, to do away with the need to dynamically measure the temperature to set capacitances of adjustment of the quartz crystal resonator frequency.

Figure 3:
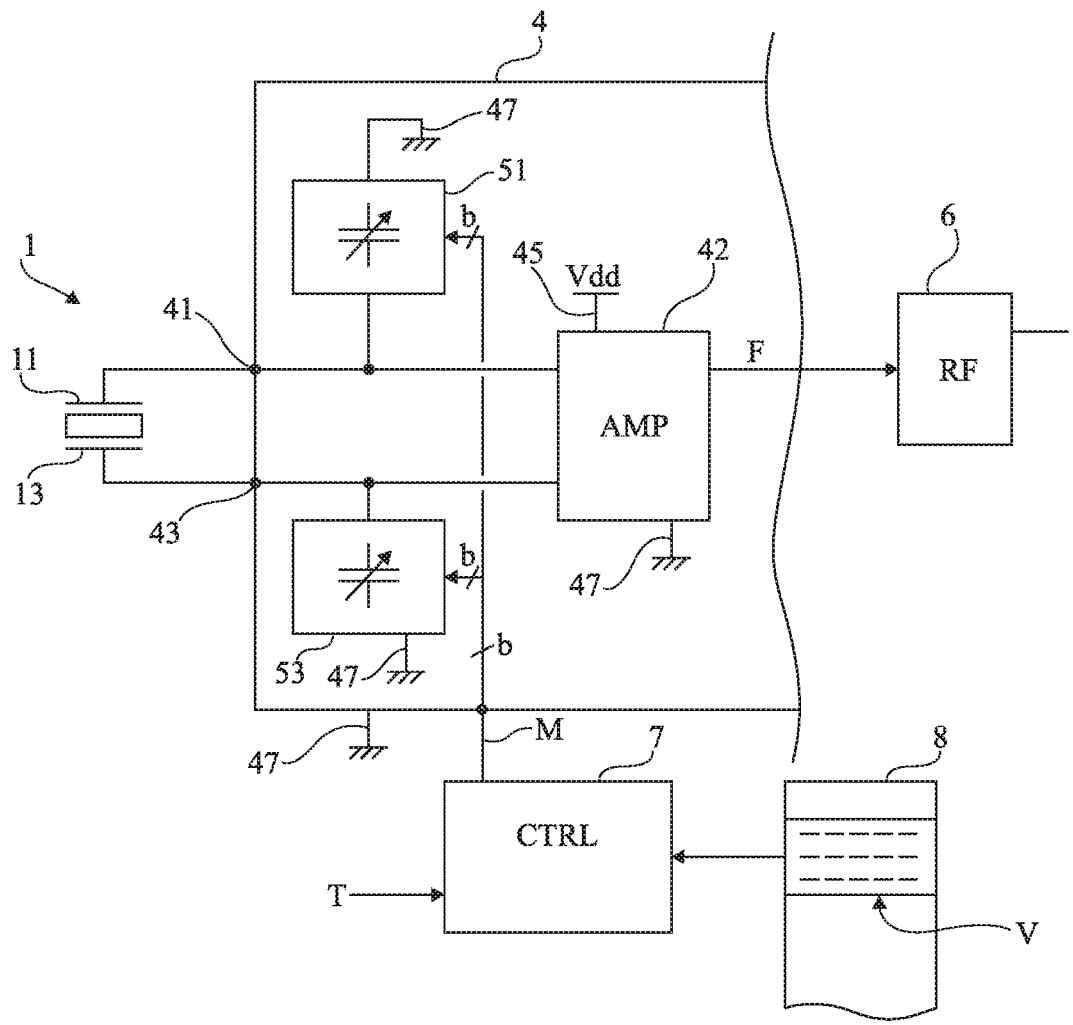
FIG. 3 very schematically shows in the form of blocks an embodiment of a circuit of temperature compensation of the frequency of a quartz crystal resonator.

FIG. 3 very schematically shows in the form of blocks an embodiment of a circuit 4 of temperature compensation of the frequency of a quartz crystal resonator.

Circuit 4 preferably forms part of the microcontroller (2, FIG. 1) which processes frequency reference F supplied by the quartz crystal resonator). The representation of FIG. 3 is simplified and circuit 4 comprises in practice many other components which are a function of the application but which are not necessary for the discussion of the described embodiments.

A quartz crystal resonator 1 is connected, by its two electrodes 11 and 13, to two input terminals 41 and 43 of circuit 4. Each terminal 41, 43 is further coupled, by a network of switchable capacitors defining a settable capacitor, respectively 51 and 53, to ground 47. If desired, only a settable capacitor is provided. Terminals 41 and 43 are, like in FIG. 1, coupled by an amplifier 42 powered with a voltage Vdd (terminals 45 and 47). Frequency F extracted from the quartz is used, among others, by a radio frequency (RF) transmit-receive chain 6, generally integrated in circuit 4 or mounted on a same printed circuit board as circuit 4.

Capacitors 51 and 53 are preferably digitally settable by a b-bit word M supplied by a control circuit 7 (CTRL). For example, on powering-on of the system, circuit 7 processes the content of a non-volatile memory 8 having a code of control of capacitors 51 and 53 stored therein according to the initial calibration performed for quartz crystal resonator 1.

Figure 4:
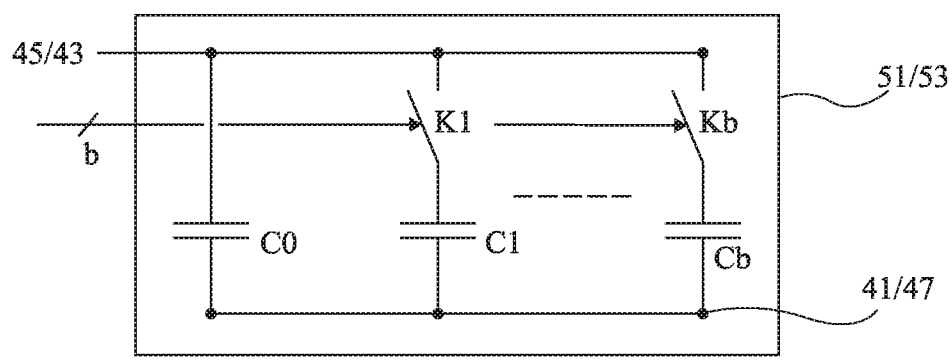
FIG. 4 very schematically illustrates an embodiment of a variable capacitor.

FIG. 4 very schematically illustrates an embodiment of a variable capacitor 51 or 53.

Capacitor 51 or 53 comprises a parallel array of b series associations of a capacitor C1, . . . , Cb with a switch K1, . . . , Kb, between the terminals (45 and 41, or 43 and 47) of capacitor 51, 53. A non-switchable capacitor C0 is preferably also in parallel with the assembly. Each bit of b-bit word M controls one of switches K to the on or off state to insert the corresponding capacitor in the electric path. As a specific embodiment, capacitor C0 has a capacitance in the order of 8 pF and the equivalent capacitance of capacitors C1 to Cb varies from 0 to 4 pF.

According to the described embodiment, the switchable capacitors are used, on each activation/stopping of radiofrequency chain 6, to compensate for an expected frequency drift due to the temperature variation.

Such a compensation uses the shape (FIG. 2) of the variation of the frequency over time due to the activation of the radio frequency transmission chain, to vary the frequency in a way opposite to the variation due to temperature and thus cancel its effects.

Due to the reproducible character of this variation, a modeling of the correction to be made over time is performed on design of the system. Such a modeling may be performed in a particularly simple way by powering on a test system, and by measuring the time variation of frequency F due to the turning on of the transmission chain. The correction to be made at the level of capacitors 51 and 53 to maintain a stable frequency F during this period is then determined. The modeling provides a table V (FIG. 3) of correction values (binary words) which are stored in the non-volatile memory 8 of all circuits manufactured in accordance with the tested system.

Assuming that the frequency time variation is substantially the same whatever the initial temperature Ti of the circuit (temperature delta Tf-Ti is always the same, as well as interval t2-t0), it is sufficient to know initial temperature Ti of the circuit at the time of the turning on of the radio frequency chain to be capable of providing, simply and with no subsequent temperature measurement, the required correction.

Advantage is here taken of the presence, in most circuits using a quartz crystal resonator, of a sensor of data representative of temperature, which is generally used for the initial calibration of the quartz crystal resonator, that is, the correction to be made to take, on powering on of the system, frequency Fi back to frequency Fn (interval x, FIG. 2).

It is possible to refine the correction made according to the initial temperature on activation of the radio frequency chain. Indeed, the frequency variation in ppm/° C. is sometimes greater for extreme temperatures.

Figure 5:
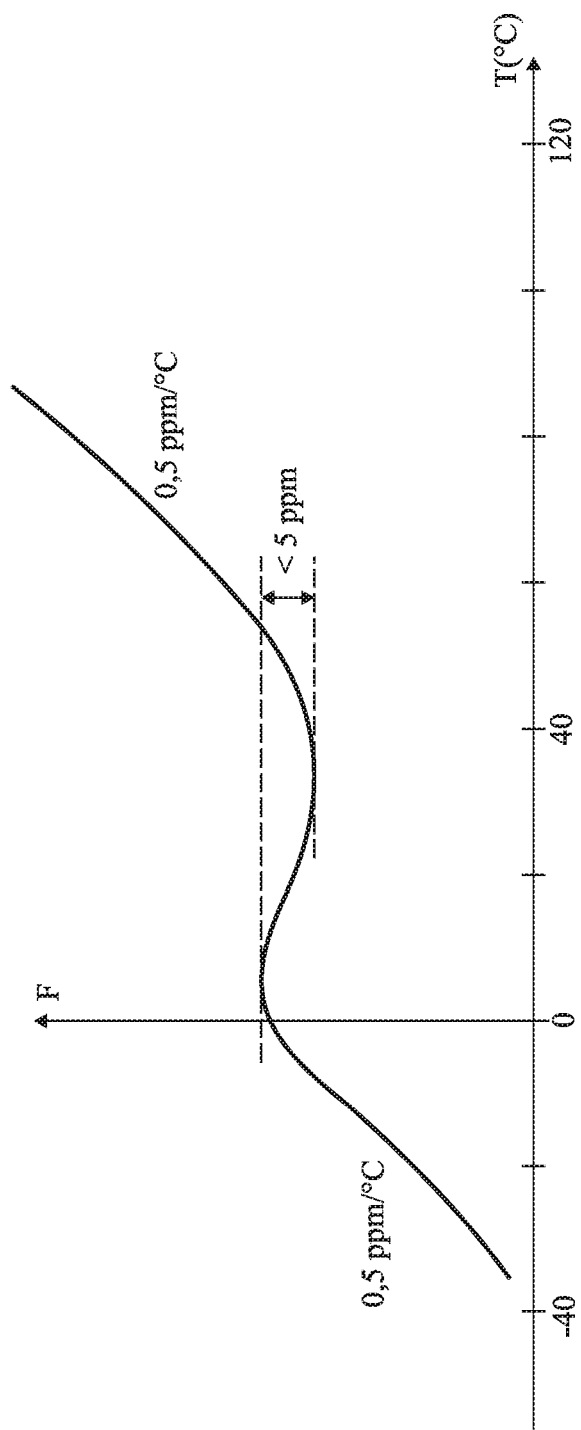
FIG. 5 illustrates an example of the frequency sensitivity of a quartz crystal resonator which is not temperature-compensated, according to temperature.

FIG. 5 illustrates an example of frequency sensitivity of a quartz crystal resonator which is not temperature-compensated according to temperature.

FIG. 5 takes as an example a quartz crystal resonator known under name AT and a maximum operating range from −40° C. to +125° C. It can be observed that the frequency variation in ppm/° C. is smaller in the temperature range from 0 to +40° C. than outside of this range. While this variation is of a few ppm only (for example, less than 5 ppm) in the entire range from 0 to +40° C., the sensitivity is in the order of 0.5 ppm/° C. outside of this range.

In the presence of a quartz crystal resonator of this type, three tables of correction values, obtained by modeling during a test in the three initial temperature situations, for example, under 0° C., at room temperature in the order of 25° C., and above 40° C., is preferably provided.

According to an alternative embodiment, the correction table(s) are replaced with a polynomial, providing binary control word M according to time t. However, the lookup table is a preferred embodiment for its simplicity in a digital setting.

According to another alternative embodiment, switchable capacitors 51 and 53 are replaced with, or are associated with, switchable resistors. A frequency adjustment of the quartz crystal by resistive or resistive and capacitive elements may indeed be found in certain embodiments. The described embodiments can be easily transposed to such embodiments.

The modeling performed during the activation of the radio frequency source is also preferably performed on turning off thereof. Thus, two models of time correction of the frequency respectively at the activation and at the turning off of the radio frequency source are available. It should however be noted that the most important is a fast reaction to a temperature increase so that the data transmission occurs at a stable frequency. It is not necessarily disturbing for the recovery of initial frequency Fi to take more time after the deactivation, that is, after the transmission, provided for this frequency to be reached at the latest at the next transmission period. In particular, although a delay between the temperature decrease and the frequency decrease has been illustrated in FIG. 2, a correction different from the inverse of the frequency decrease of FIG. 2 may be provided, provided for the frequency to be corrected at least during the transmission period.

An advantage of the embodiments, according to the first above aspect, is that all the components required for the provided temperature time compensation are present in existing circuits using a quartz crystal resonator for radio frequency transmissions. Thus, the implementation of the described solutions requires no hardware modification of the system and is thus little expensive to implement.

Another advantage is that it is done away with a dynamic measurement of the quartz temperature. Indeed, advantage is taken from the fact that, although the response of a quartz crystal resonator to temperature variations is difficult to be accurately known, the reproducible character of the variation of the frequency due to the heating allows a reliable modeling with no temperature measurement. The compensation is triggered by an activation of the transmission. The fact of performing the modeling with respect to time and not with respect to temperature here makes this modeling possible and reliable.

In the case taken as an example of a binary switching of the capacitors which could be seen as generating a problem, in particular at the passing of the most significant bit of the control word (for example, from 31 to 32 for a 6-bit word), the effect is actually compensated for by the time constant of the quartz crystal resonator, which filters the frequency hopping which might otherwise occur.

The accuracy of the adjustment performed over time by application of the modeling illustrated in FIG. 2 depends on the resolution of the adjustment of capacitances 51 and 53, and thus on number b of adjustment bits.

For example, with a quartz crystal resonator having an average sensitivity in the order of 0.5 ppm/° C. (in practice slightly smaller than 0.5 ppm/° C., taking the example of FIG. 5 because of the range from 0 to +40° C.), the resolution of the setting performed by a 6-bit word (6 switchable capacitors in each capacitor 51 and 53) is in the order of 1 ppm/bit.

Such a resolution is generally admitted for the static correction at the powering on of the circuit. It is however not sufficient for a compensation of the temperature variation due to the activation of a radio frequency chain generating several hundreds of milliwatts, as in a LoRa application. Indeed, in such an application, an adjustment accuracy in the order of 0.15 ppm is desired, that is, it is desired to be able to maintain frequency F within a range of +/−0.15 ppm.

According to an embodiment, the resolution of capacitors 51 and 53 is increased at the cost of a larger control bus (over 10 bits, taking the above example) and of an increase in the number of controllable capacitors (from 6 To 10) in each capacitor 51 and 53.

According to a second aspect of the present description, a specific control of the switchable capacitors enabling to functionally increase the resolution of the setting is provided. In other words, it is provided to provide an accuracy of the quartz crystal resonator frequency adjustment greater than $2^b$, where b represents the number of switchable capacitors of capacitors 51 and 53.

To achieve this, a pulse control of variable width according to the additional accuracy desired with respect to the granularity of the setting of capacitors 51, 53, that is, to the frequency variation provided by each bit, is provided for each bit.

Advantage is here taken of the damping provided by the quartz crystal resonator of capacitors 51 and 53 on the frequency increase (or decrease), that is, of the quartz response time.

Figure 6A:
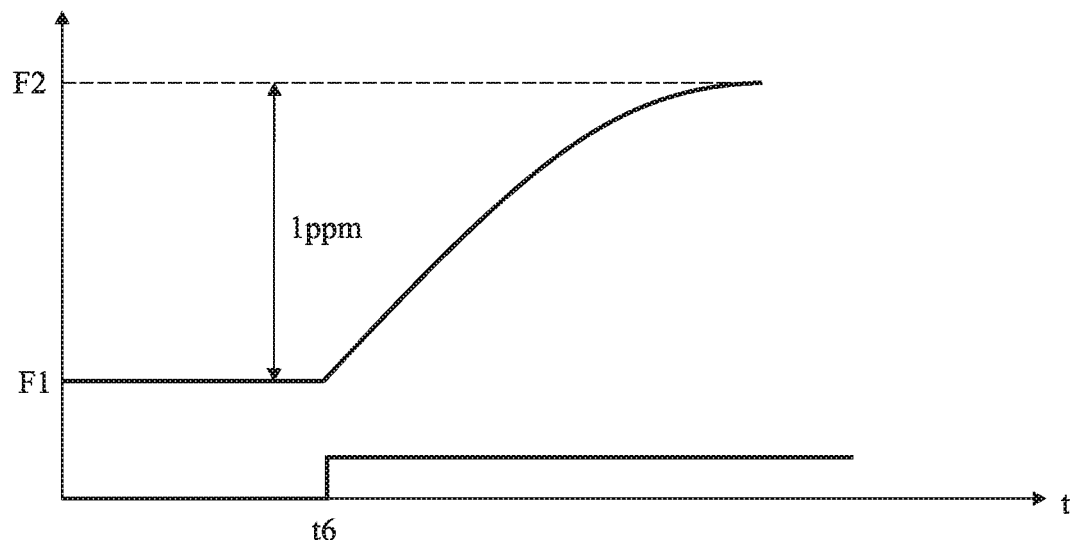
FIGS. 6A and 6B illustrate an implementation mode of a method of adjusting the frequency of a quartz crystal resonator by means of switchable capacitors.
Figure 6B:
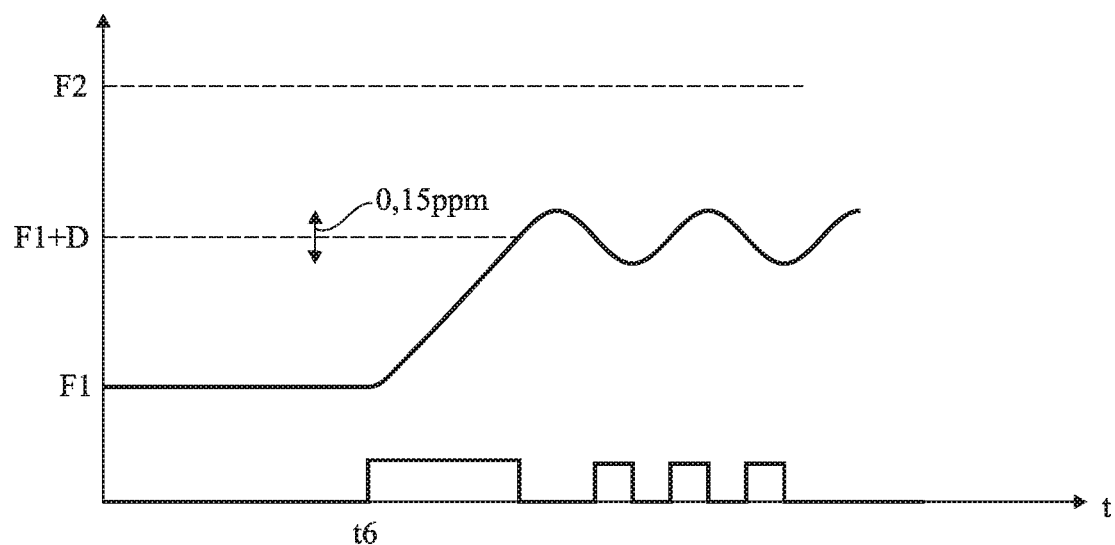

FIGS. 6A and 6B illustrate an implementation mode of a method of adjusting the frequency of a quartz crystal resonator with a switchable capacitor.

As for the first aspect, the described solution transposes to an adjustment by switchable resistors or to a mixed adjustment.

These drawings illustrate the frequency variation over time in two examples of control with a same binary word M, that is, a switching of the same capacitor(s) of capacitor 51 and/or 53.

FIG. 6A illustrates the passing from a frequency F1 to a frequency F2 by an increment of a bit of word M of control of capacitors 51 and 53. It is here assumed that the switching is maintained. Thus, the frequency increment corresponds, considering the previously-mentioned example over 6 bits, to 1 ppm, which represents the interval between frequencies F1 and F2 As illustrated in FIG. 6A, the passing from frequency F1 to frequency F2 is not abrupt at the switching (time t6) but is dampened by the response time of the quartz crystal resonator associated with capacitors 51 and 53. This phenomenon is used to increase the resolution and provide a better accuracy.

FIG. 6B illustrates the passing from a frequency F1 to a frequency F1+Δ intermediate between frequencies F1 and F2. The control signal (word M) is here pulse-width modulated not only to stop the frequency increase when value F1+Δ is reached, but also to maintain the frequency around value F1+Δ with the desired accuracy (0.15 ppm in this example). In practice, this results in a control pulse which is initially wider (or a higher pulse frequency) to increase the frequency up to the desired value F1+Δ, and then in pulses of smaller width to maintain the frequency around the set point.

The frequency of the control pulses conditions the oscillation around set point frequency F1+Δ. Advantage is taken of the fact that the time response of the quartz crystal resonator to a capacitance variation is deterministic to set this frequency. For example, assuming that the response time of a quartz crystal resonator at 32 MHz (nominal frequency) is in the order of some hundred microseconds for a 1-ppm increase (32 kHz), a frequency in the order 3 MHz for the cut-off pulses of the control signals of capacitive arrays provides a resolution in the order of 0.1 ppm.

An embodiment according to the second aspect has the advantage of enabling to only use binary words over a smaller number of bits, and thus simpler settable capacitors, while allowing a higher accuracy and resolution than that provided by the number of bits alone.

An advantage is that this enables to increase the resolution and the stability of an existing circuit without having to modifying its structure.

The embodiments described according to the second aspect are particularly advantageous when combined with the first aspect. Indeed, to know the model of frequency increase along time according to the first aspect, the same quantity (time) as that conditioning the frequency values according to the second aspect is used.

It should however be noted that the embodiments described in relation with the second aspect more generally apply to any frequency adjustment of a quartz crystal resonator by a settable array of capacitors and/or of resistors, for example, after a measurement of the quartz crystal resonator temperature or for the initial calibration of the quartz crystal resonator oscillator.

As a specific embodiment, a system such as described hereabove is implemented with, as a microcontroller, a microcontroller belonging to a category of microcontrollers known as STM32.

An advantage of the two described aspects is that their implementation is compatible with a software implementation and then requires no hardware modification. Thus, according to an embodiment, the existing hardware functions of a microcontroller are used.

Another advantage of the described embodiments is that they are compatible with any other solution for compensating for the temperature drift of a frequency supplied by a quartz crystal resonator. In particular, they may come as a complement of these other solutions.

Various embodiments and variations have been described, such various embodiments and variations being combinable. Various modifications will occur to those skilled in the art. In particular, the selection of the pulse widths and of their frequency in the second aspect depends on the application. Further, all that has been described in relation with a temperature increase easily transposes to a temperature decrease. Moreover, the selection of the number of tables of correction values in the first aspect depends on the modeling performed on design. It should be noted that the time required for the modeling is perfectly compatible with an industrial implementation since, due to the reproducible character of the behavior of a quartz crystal resonator towards a temperature variation, the time analysis performed on design is sufficiently reliable. It should be noted that, although the embodiments have been more particularly described in relation with the example of the LoRa standard, they more generally transpose to any application where similar problems are posed, particularly for systems where reproducible temperature increases, capable of being modeled, can be observed. Further, although the first aspect is preferably implemented with an array of switchable capacitors or resistors, an embodiment with an analog variable capacitor (varicap) should not be excluded, particularly if the correction function is a polynomial. Finally, the practical implementation of the embodiments which have been described is within the abilities of those skilled in the art based on the functional indications given hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A method of controlling a quartz crystal resonator coupled to an electronic circuit, comprising:
in response to an activation of an operating function of the electronic circuit which produces an increase in temperature of the quartz crystal resonator, controlling at least one capacitive or resistive element for gradually adjusting a capacitance or resistance value of said capacitive or resistive element to maintain stability of a frequency of the quartz crystal resonator over a time period following said activation, wherein the gradual adjustment of the capacitance or resistance value is made according to a model of an expected frequency drift as a function of elapsed time from the activation of the operating function.

2. The method of claim 1, wherein said model is applied to an initial temperature measured on activation of the operating function.

3. The method of claim 1, wherein said model is represented by a table of control values for said capacitive or resistive element.

4. The method of claim 1, wherein said at least one capacitive or resistive element is an array of switchable capacitors.

5. The method of claim 4, further comprising pulse-width modulation controlling of switching of at least one capacitor in said array of switchable capacitors.

6. The method of claim 1, further comprising generating said model by measuring variation of the quartz crystal resonator frequency over said elapsed time from activation of said operating function.

7. The method of claim 6, wherein said measurement of the variation of the quartz crystal resonator frequency is performed on a test circuit.

8. The method of claim 1, wherein said operating function is a radio frequency transmission function.

9. The method of claim 1, wherein the gradual adjustment substantially compensates for the expected frequency drift over said elapsed time due to the increase in temperature.

10. An electronic device, comprising:
a circuit; and
a quartz crystal resonator;
wherein the circuit is configured to control at least one capacitive or resistive element for gradually adjusting a capacitance or resistance value of said capacitive or resistive element to maintain stability of a frequency of the quartz crystal resonator over a time period following activation of an operating function of an electronic circuit which produces an increase in temperature of the quartz crystal resonator, wherein said gradual adjustment of the capacitance or resistance value is made according to a model of an expected frequency drift as a function of elapsed time from the activation of the operating function.

11. The device of claim 10, wherein said circuit is a microcontroller.

12. The device of claim 10, wherein said model is represented by a table of control values for said capacitive or resistive element.

13. The device of claim 10, wherein said at least one capacitive or resistive element is an array of switchable capacitors.

14. The device of claim 13, further comprising a circuit configured to effectuate a pulse-width modulation control over switching of at least one capacitor in said array of switchable capacitors.

15. The device of claim 10, wherein said operating function is a radio frequency transmission function.

16. The device of claim 10, wherein the gradual adjustment substantially compensates for the expected frequency drift over said elapsed time due to the increase in temperature.

17. A circuit, comprising:

a quartz crystal resonator having a first terminal and a second terminal;

a first switchable capacitor circuit coupled between the first terminal and a reference node;

a second switchable capacitor circuit coupled between the second terminal and the reference node;

a control circuit configured to control operation of the first and second switchable capacitor circuits to gradually adjust a capacitance of one or more of the first and second switchable capacitor circuits to maintain stability of a frequency of the quartz crystal resonator over a time period following activation of an operating function of an electronic circuit which produces an increase in temperature of the quartz crystal resonator, wherein said gradual adjustment in capacitance is made according to a model of an expected frequency drift as a function of elapsed time from the activation of the operating function.

18. The circuit of claim 17, wherein each of the first and second switchable capacitor circuits is implemented by an array of switchable capacitors.

19. The circuit of claim 17, wherein said model is represented by a table of control values for said first and second switchable capacitor circuits.

20. The circuit of claim 17, wherein said first and second switchable capacitor circuits are an array of switchable capacitors.

21. The circuit of claim 20, further comprising pulse-width modulation controlling of said array.

22. The circuit of claim 17, wherein said model is obtained by measurement of the variation of the frequency supplied by the quartz crystal resonator over said elapsed time from activation of said operating function.

23. The circuit of claim 17, wherein the gradual adjustment substantially compensates for the expected frequency drift over said elapsed time due to the increase in temperature.

* * * * *